United States Patent [19]

Petranovich

[11] Patent Number: 5,542,095
[45] Date of Patent: Jul. 30, 1996

[54] FREQUENCY REFERENCE COMPENSATION

[75] Inventor: James E. Petranovich, Encinitas, Calif.

[73] Assignee: Pacific Communication Sciences, San Diego, Calif.

[21] Appl. No.: 110,611

[22] Filed: Aug. 24, 1993

[51] Int. Cl.$^6$ ............................................. H04B 1/40
[52] U.S. Cl. .................... 455/76; 455/71; 455/183.2; 455/264
[58] Field of Search ........................ 455/71, 75, 76, 455/164.2, 182.2, 183.2, 192.2, 197.1, 260, 264

[56] References Cited

U.S. PATENT DOCUMENTS

| | | | |
|---|---|---|---|
| 4,345,692 | 8/1982 | Obrist et al. | 215/252 |
| 4,438,528 | 3/1984 | Itagaki | 455/182 |
| 4,498,191 | 2/1985 | Rogers | 455/164 |
| 4,691,377 | 9/1987 | Yoshihara et al. | 455/256 |
| 4,696,056 | 9/1987 | Morita | 455/182 |
| 4,703,520 | 10/1987 | Rozanski et al. | 455/75 |
| 4,932,072 | 6/1990 | Toko | 455/183.2 |
| 4,942,374 | 7/1990 | Sai | 455/76 |
| 4,959,872 | 9/1990 | Imai et al. | 455/192.2 |
| 5,113,416 | 5/1992 | Lindell | 375/97 |
| 5,170,492 | 12/1992 | Moller et al. | 455/76 |
| 5,170,497 | 12/1992 | Uchikura | 455/183.2 |
| 5,287,388 | 2/1994 | Ogura et al. | 455/192.2 |

FOREIGN PATENT DOCUMENTS 439326A  7/1991  European Pat. Off. ................ 455/75

*Primary Examiner*—Edward F. Urban
*Attorney, Agent, or Firm*—Woodcock Washburn Kurtz Mackiewicz & Norris

[57] ABSTRACT

The present invention provides a frequency tracking and compensation system and methods for minimizing the frequency offset between remote and local units of a communications system. The system of the present invention resides in the local unit and comprises a downconverter, a digital transceiver, a processor, a reference oscillator and a frequency synthesizer. The downconverter mixes a signal received from the remote unit with a local oscillator (LO) signal generated by the frequency synthesizer. The frequency of the LO signal is based on the frequency of a reference signal generated by the reference oscillator. The system of the present invention utilizes the digital transceiver to determine a frequency offset of the received signal without comparing the received signal to the reference signal. The processor then utilizes the frequency offset to adjust the frequency of the reference signal. The method of the present invention accumulates the frequency offsets and compares the accumulated offset to a predetermined threshold. The reference frequency is adjusted if the accumulated offset exceeds the threshold. In one embodiment, the reference frequency is adjusted after complete reception of each call.

18 Claims, 3 Drawing Sheets

FREQUENCY REFERENCE COMPENSATION

CROSS-REFERENCE TO RELATED APPLICATIONS

This application is related to application Ser. No. 999,210, filed Dec. 31, 1992, now U.S. Pat. No. 5,376,894, which is assigned to the same assignee and is incorporated herein by reference.

FIELD OF THE INVENTION

The present invention relates to a frequency tracking and compensation system, and more particularly to minimizing frequency error between remote and local units of a communications system.

BACKGROUND OF THE INVENTION

Communications systems, such as a digital cordless telephone (DCT) system typically comprise one or more centralized communication stations, each of which may communicate with one or more localized stations. For instance, in a DCT system portable handheld telephone units communicate with each other either through a single central station or through inter connected parent stations. Each parent station acts as a centralized station (hereinafter referred to as a remote unit) and the portable telephone units are local units.

Transmission and reception between the remote and local units should occur at specific operating frequencies within an operation band. However, to optimize the number of communications occuring concurrently within the band, the frequencies used must remain stable over long periods of time. Typically, the transmission frequencies are generated using a reference oscillator such as a voltage controlled oscillator. Therefore, the stability of the operating frequencies depends upon the stability of the reference frequency generated by the reference oscillator. Variation of the reference frequency can result from fluctuations in temperature and aging of the oscillator.

Perhaps the simplest method for optimizing the stability of the operating frequencies is to utilize an oscillator with a very accurate reference frequency. However, the use of such oscillators may become prohibitive due to cost.

A number of frequency control systems have been developed to compensate for temperature and aging effects on the stability of the reference frequency. Most of these techniques compare the reference frequency or phase with an appropriate measure of the received signal's frequency or phase. For instance, it is known to use a phase locked loop to frequency lock the reference signal to the receive signal. However, these techniques require continuous monitoring of the reference signal which in turn requires additional hardware and software.

To minimize the cost and complexity of a system capable of compensating for changes in the frequency of a reference signal, it is desirable to use a standard VCO and eliminate the need for the aforementioned additional hardware and software.

SUMMARY OF THE INVENTION

The present invention fulfills the need to reduce the cost and complexity of the prior art systems by providing a frequency tracking and compensation system residing in the local unit and comprising a downconverter, a modem, a VCO, and a frequency synthesizer. The downconverter mixes a received signal with a local oscillator (LO) signal generated by the frequency synthesizer. The frequency of the LO signal is based upon the frequency of a reference signal generated by the VCO, which is preferably temperature compensated. The modem accepts an input of the downconverted signal and determines a frequency offset of the received signal. The reference frequency may then be adjusted by making an adjustment to the VCO based on the frequency offset to minimize the frequency offset. The adjusted reference frequency is thereafter used by the local unit to transmit signals to the remote unit as well as receive further signals transmitted from the remote unit.

According to one method of the present invention the local oscillator signal generated is based on the frequency of the reference signal and mixed with a signal received from the remote unit to produce a downconverted signal. The frequency offset is then determined based on a difference between the frequency of the downconverted signal and a predetermined frequency of the downconverted signal. The frequency offset can then be substantially minimized by adjusting the reference signal based on the frequency offset. In a preferred embodiment, a frequency offset is determined after each transmission from a remote unit. A frequency control value representative of a frequency of the reference signal is preferably generated by a processor. A plurality of frequency offsets may be accumulated and compared to a predetermined threshold. The frequency control value may then be incremented if the accumulated offset value is greater than the predetermined threshold or the frequency control value may be decremented if the accumulated offset value is less than the predetermined threshold.

According to another method of the present invention the frequency offset between the remote unit and the local unit is substantially minimized by transmitting a signal having a predetermined operating frequency from the remote unit to the local unit such that the local unit receives the transmitted signal, determines a frequency offset indicative of a difference between the predetermined operating frequency and a frequency of the transmitted signal as received by the local unit, and then adjusts a local reference frequency of the local unit based on the frequency offset to substantially minimize the frequency offset. The adjusted local reference frequency is preferably utilized by the local unit to subsequently transmit a signal to the remote unit. In a further preferred embodiment, a number of transmissions between the remote and local units define a call. The local reference frequency may be adjusted, in this preferred embodiment, upon completion of each call.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION

Figure 1:
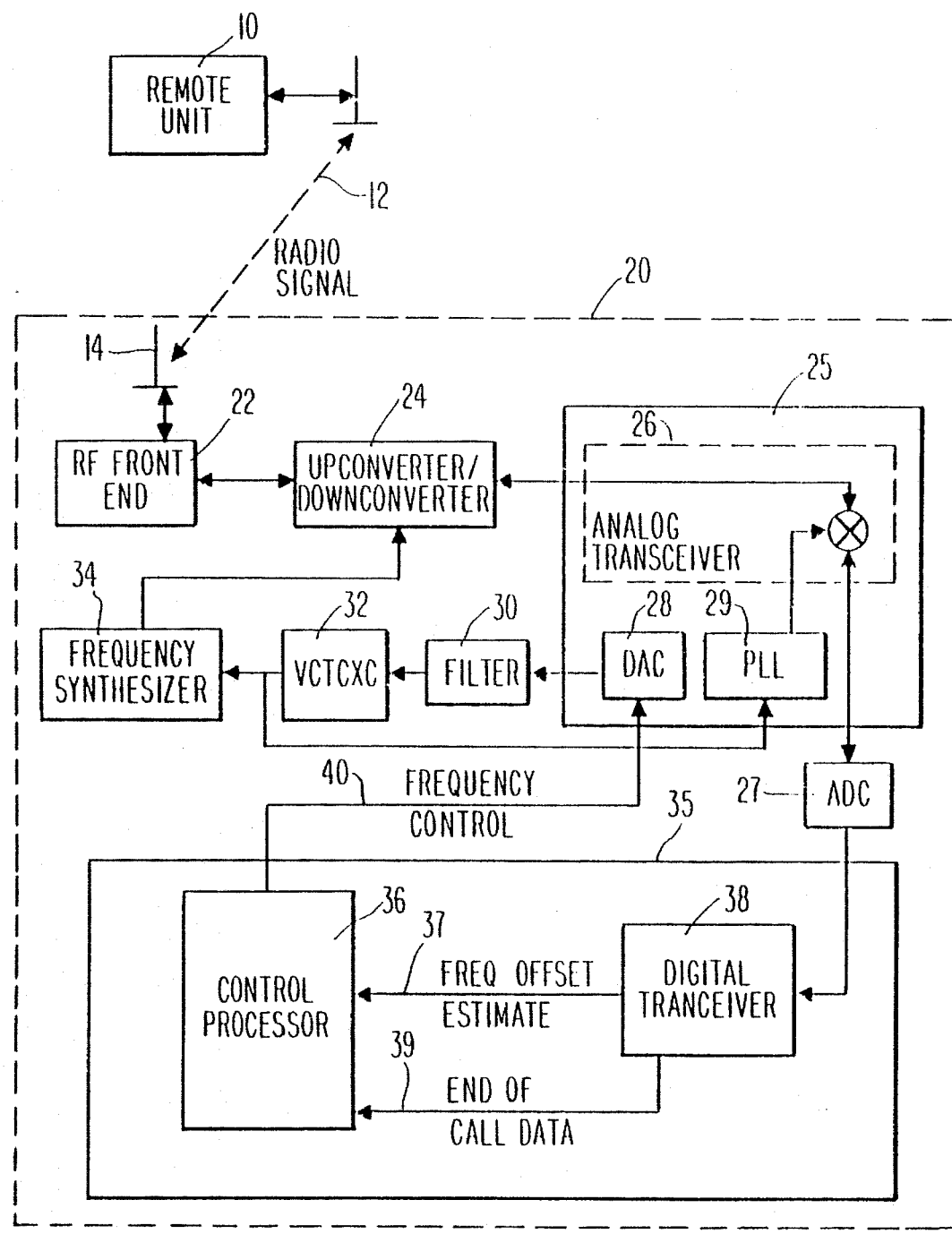
FIG. 1 is a block diagram of the frequency tracking and compensation system according to the present invention.

A block diagram of a preferred embodiment of the present invention is shown in FIG. 1. A remote unit 10, such as parent cordless station or a public base station, is shown to have a communications link 12 with a local unit 20, such as a portable handheld unit of a digital cordless telephone. Frequency compensation within local unit 20 will be described for receive and transmit modes of operation.

In the receive mode, the remote unit 10 transmits information to the local unit 20. In a preferred embodiment the transmission is provided by a Quadature Phase Shift Keyed (QPSK) signal having a transmit frequency between 1.895 and 1.915 GHz. Antenna 14 and the RF front end circuitry 22 of local unit 20 detect and receive the transmitted signal. The received signal is downconverted by upconverter/downconverter 24 which serves as a downconverter during the receive mode and as an upconverter during the transmit mode. A local oscillator (LO) signal is provided by frequency synthesizer 34 to the upconverter/downconverter 24 where the received signal is essentially mixed with the LO signal to generate the downconverted signal. In a preferred embodiment, the received signal is downconverted to 248.54 MHz. Therefore, in this preferred embodiment the frequency of the LO signal should be about 1.64655 GHz (1.895 GHz–248.54 MHz).

The downconverted signal is further downconverted to an intermediate frequency (IF), preferably 1.152 MHz by analog transceiver 26. Analog transceiver 26 also filters the IF signal and provides gain adjustments using well known techniques.

The IF signal is then digitized by A/D converter 27 and provided as an input to digital transceiver 38. During the receive mode digital transceiver 38 serves as a demodulator. In a preferred embodiment, the A/D converter 27 and digital transceiver 38 are implemented as the limiter/sampler circuit and the demodulator described in co-pending application Ser. No. 999,210 which is incorporated herein by reference. Digital transceiver 38 determines a frequency offset of the received signal by comparing characteristics of the IF signal with corresponding characteristics of a hypothetical IF signal to determine the local unit's frequency offset. For instance in a preferred embodiment, the IF signal should have a frequency of 1.152 MHz. However, as described above, the IF signal frequency may drift due to aging of the voltage controlled oscillator. It should be understood that numerous techniques are known for estimating the frequency error and therefore the details of such techniques will not be described herein. However, determining the frequency error based on the phase of the received signal is one example and is described in copending application Ser. No. 999,210.

The digital transceiver 38 outputs the frequency offset estimate to control processor 36 via interface 37. Control processor 36 processes the frequency offset estimate to determine a frequency control value. Control processor 36 uses the frequency control value to generate a binary frequency control word. The frequency control word is provided as an N-bit digital input to D/A converter 28 via interface 40. D/A converter 28 converts the frequency control word into an analog signal having a magnitude corresponding to the frequency control value.

The analog signal is filtered by filter 30 to substantially eliminate noise. Preferably, filter 30 has a long time constant, e.g., 1 ms., to avoid abrupt changes in the frequency of the LO signal. The filtered analog signal is provided as an input to the voltage controlled oscillator (VCO) 32. In preferred embodiments, VCO 32 is a voltage controlled temperature compensated oscillator (VCTXO). VCO 32 generates a reference signal which has a frequency related to the magnitude of the analog signal output from filter 30. The reference signal is provided as an input to frequency synthesizer 34. Frequency synthesizer 34 then generates the LO signal having a frequency based on the frequency of the reference frequency. Although a customized frequency synthesizer may be used, see e.g., co-pending application Ser. No. 131,210, numerous synthesizers can be used that are commercially available from Signetics, Motorola and other manufacturers.

The frequency compensation system shown in FIG. 1 will now be further described by example based on a DCT system. As mentioned above, signals are preferably transmitted at 1.895 GHz, downconverted by upconverter/downconverter 24 to 248.54 MHz using an LO signal having a frequency of 1.64566 GHz. In a further preferred embodiment, D/A converter 28 is a 5-bit D/A. Therefore, the frequency control value comprises a 5-bit word having a range from 0 to 31. Preferably, control processor 36 initializes the frequency control value to the mid-point of the frequency control value range which would correspond to a value of 15 in this preferred embodiment. Then the frequency control value is incremented or decremented depending upon the frequency offset determined by digital transceiver 38 preferably following each call. To this end, an interface 39 is provided between the digital transceiver 38 and the control processor 36 so that the digital transceiver 38 may inform the control processor 36 when the end of a call has been detected.

Figure 2:
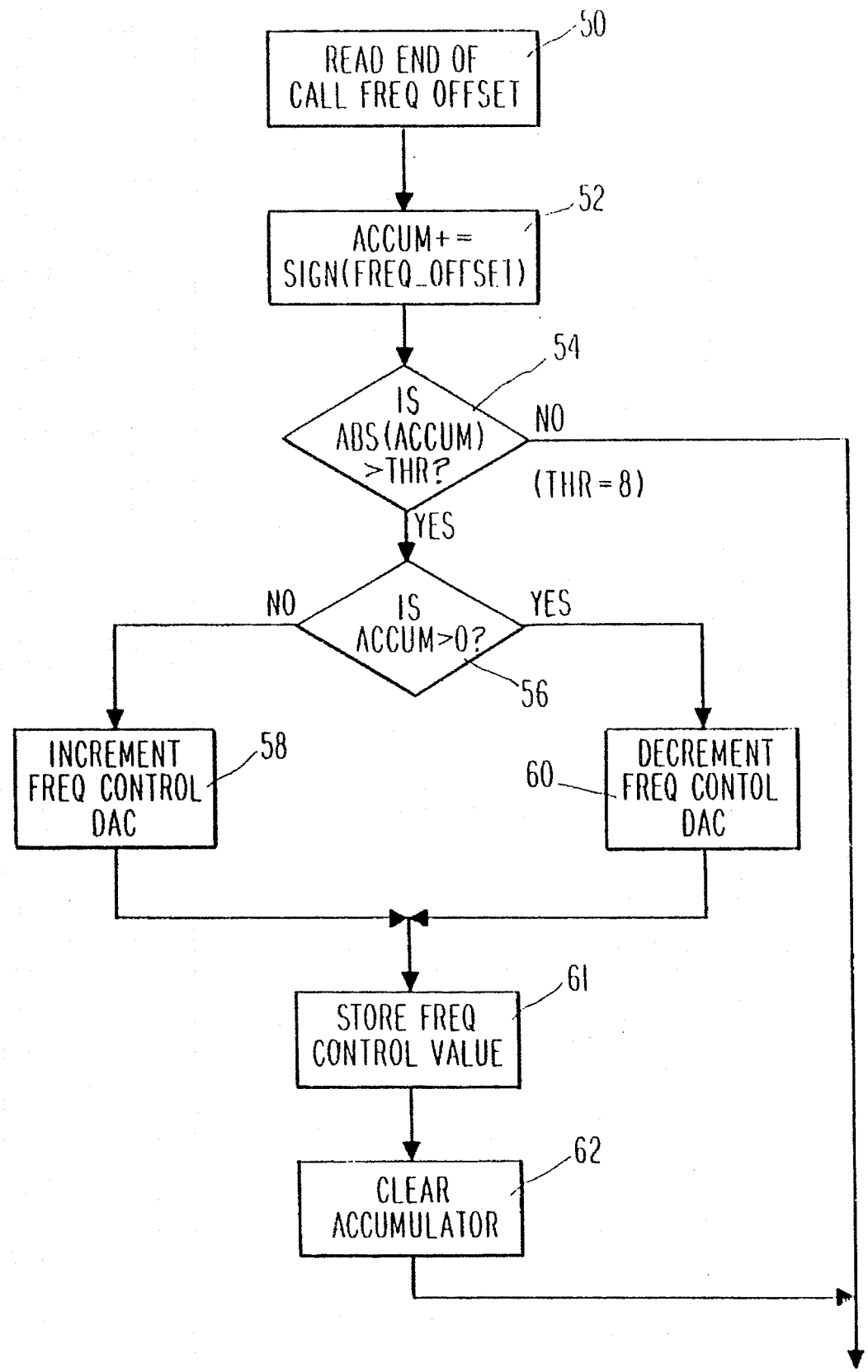
FIG. 2 is a flowchart showing a preferred procedure implemented by the control processor of the present invention for adjusting the frequency control value.

A flowchart of the procedure used by control processor 36 to increment or decrement the frequency control value in a preferred embodiment is shown in FIG. 2. At the end of each call, the control processor reads the frequency offset estimate from the digital transceiver as shown at 50. The control processor accumulates each frequency offset estimate at 52. Preferably, step 52 is implemented by providing an accumulator which is incremented for each positive frequency offset estimate and decremented for each negative frequency offset estimate. If the absolute value of the accumulator is less than a predetermined threshold as determined at 54, the control processor waits for the next end of call message from the digital transceiver as shown at 54. However, if the absolute value of the accumulator is greater than the predetermined threshold at 54, the frequency control value will be adjusted by either incrementing at 58 or decrementing at 60 depending upon whether the accumulator is positive or negative as determined at 56. The adjusted frequency control value is then stored by the control processor at 61 and the accumulator cleared at 62.

In a further preferred embodiment, the VCO 32 is powered down when the local unit is not receiving or transmitting to conserve power. The frequency control value is thus stored in a nonvolatile memory of control processor 36 so that the frequency compensation achieved over previous receptions is not discarded.

As an example, assume the threshold is set to 8. Further assume the frequency offset estimate at the end of nine consecutive calls is positive. The accumulator will have been incremented to a value of 9 as shown in FIG. 2 at 52. Since 9 is greater than the threshold of 8 and is positive, the frequency control value of 15 will be incremented to 16 at 58.

The adjustment to the frequency control value will result in an adjustment to the reference frequency and subsequently the frequency of the LO signal. For instance, assume the frequency control value is incremented from 16 to 17 in the preferred embodiment described above. If the VCO has an accuracy of ±5 PPM (parts per million), then the reference frequency of the VCO is accordingly increased by 5 PPM/16. The LO frequency is then correspondingly increased by (5*10⁻⁶/16) (1.895 GHz) or 592.188 Hz resulting in an LO frequency of 1,645,660,952 Hz.

It should be understood that although in a preferred embodiment control processor 36 is provided to execute the accumulation and comparison functions in software, the control processor 36 or the digital transceiver 38 could merely convert the frequency offset into the frequency control input 40 to the D/A converter 28.

The operation of frequency tracking and compensation according to the present invention in the transmit mode will now be described. Referring back to FIG. 1, the digital transceiver 38 serves as a digital modulator in the transmit mode and accordingly provides a digital output representing the information to be transmitted from local unit 20 to remote unit 10. The digital output is converted to a corresponding analog signal having a baseband or low IF frequency which is upconverted by the analog transceiver 26 to a signal having an intermediate frequency. The analog transceiver 26 preferably adjusts the signal gain and provides filters for eliminating spurious signals and noise using well known techniques.

The control processor 36, as described above, stores the last frequency control value used during the receive mode. During the transmit mode, control processor 36, provides the stored frequency control value to D/A converter 28. D/A converter 28, filter 30, VCO 32, and the frequency synthesizer 34 operate identically in both transmit and receive modes. Therefore, frequency tracking occurs during the receive mode, and any adjustments made to the reference frequency following the receive mode are maintained during the subsequent transmission.

Figure 3:
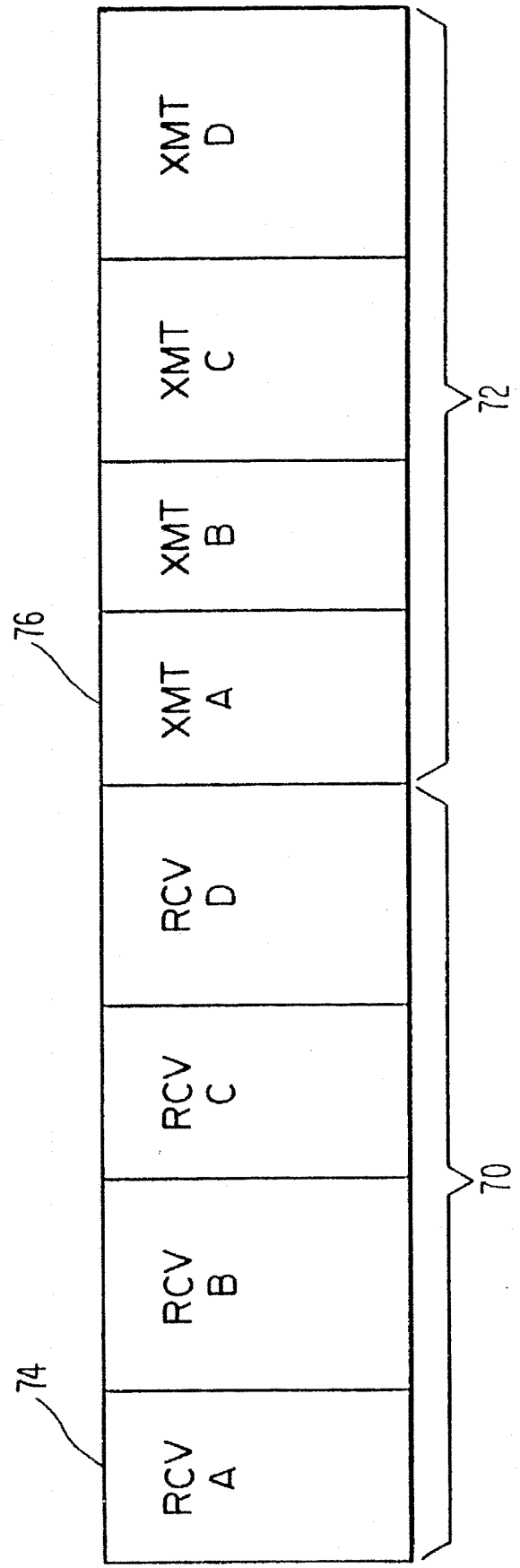
FIG. 3 depicts a Time Division Duplexing (TDD) protocol in which the present invention preferably operates.

For example, assume that the local unit 20 is a portable handheld unit of a digital cordless telephone and the remote unit 10 is the portable unit's parent cordless station. Further assume that the communication protocol supported by the digital cordless telephone system is a TDD (Time Division Duplexing) based protocol. FIG. 3 depicts a typical TDD protocol scheme. As shown in FIG. 3, a number of transmission slots 72 and an equal number of receive slots 70 are provided. Thus, the portable unit may receive a message transmitted by the parent station in receive slot A designated 74. To respond, the portable unit transmits a message back to the parent station in transmit slot A designated as 76. The frequency control value processed and stored during the most previous slot is preferably used for the next transmission and reception. During each slot, the frequency offset value is estimated. At the end of the reception, the control processor performs the procedure described above in conjunction with FIG. 2 to increment or decrement the frequency control value accordingly. In a DCT system, it is also preferable to adjust the frequency control value after a call has been completed and then use the adjusted frequency control value during the next call.

In a further preferred embodiment, more than one frequency control value and more than one threshold may be used by the frequency tracking and compensation system. For instance, a different frequency control value may be required for communications with each different remote unit, e.g., portable unit's parent cordless station or a public base station. Similarly, as mentioned above the threshold should be set so that the reference frequency changes slowly to avoid overcompensation and jitter. For example, if the local unit is a portable handheld DCT and it is communicating with a parent station, the expected number of calls received by the portable unit might be 8 per day. Thus, if it was desired not to adjust the reference frequency more than once per day the threshold would be set at 8. Alternatively, the portable unit might be expected to receive only 5 calls per day from a public base station. Then the threshold used to compensate the local frequency when communicating with the public base station may be set to only 5.

While the invention has been described and illustrated with reference to specific embodiments, those skilled in the art will recognize that modifications and variations may be made without departing from the principles of the invention as described hereinabove and set forth in the following claims. It should be further understood that the present invention is in no way limited to the preferred frequencies specified herein, but rather numerous other frequencies could be selected depending on the particular application in which the present invention is utilized.

I claim:

1. A frequency reference compensation system, comprising:

a downconverter for mixing a received signal with a local oscillator signal to provide a downconverted signal, the downconverted signal being output from said downconverter;

a demodulator interfaced with said downconverter for determining a frequency offset between a frequency of said downconverted signal and a predetermined frequency of the downconverted signal, said demodulator providing a frequency control signal representative of said frequency offset;

an accumulator coupled to said demodulator for accepting each said frequency offset so determined and accumulating values indicative of said frequency offsets;

a comparator coupled to said accumulator for comparing said accumulated values to a predefined threshold and following a complete reception of said received signal adjusting said frequency control signal to define an adjusted frequency control signal based on said comparison;

a voltage controlled oscillator interfaced with said comparator for accepting said adjusted frequency control signal and for generating a reference signal having a reference frequency based on said frequency offset; and a frequency synthesizer coupled to said voltage controlled oscillator and having an input of said reference signal and generating said local oscillator signal based on said reference frequency thereby adjusting said frequency of said downconverted signal to minimize the frequency offset.

2. The system of claim 1, wherein said voltage controlled oscillator is temperature compensated.

3. The system of claim 1, wherein said accumulator and said comparator are implemented by a processor.

4. The system of claim 1, further comprising:

a filter interfaced with said demodulator for filtering the frequency control signal.

5. The system of claim 1, further comprising:

a processor coupled to said demodulator having a memory for storing said frequency offset, said processor generating said adjusted frequency control signal when information is to be transmitted, said information to be transmitted having been formed into a transmit signal; and an upconverter for mixing said transmit signal with said local oscillator signal to produce an upconverted signal.

6. In a communications system having at least one remote unit and at least one local unit which transmit signals therebetween in the form of calls, a method of adjusting a frequency of a reference signal of said at least one local unit to track a frequency of a signal being transmitted from said at least one remote unit, said signal so transmitted defining a remote signal, comprising the steps of:

generating a local oscillator signal based on said reference signal;

mixing said remote signal with said local oscillator signal to produce a downconverted signal;

determining, upon the completion of each call, a frequency offset defining a difference between a frequency of said downconverted signal and a predetermined frequency of said downconverted signal; and adjusting the frequency of said reference signal after any said call, but not during any said call, based on said frequency offset to minimize said frequency offset thereby eliminating signal distortion of the downconverted signal when the frequency of said reference signal is so adjusted.

7. The method of claim 6, further comprising the steps of:

generating a frequency control value, based on said frequency offset, said frequency control value determining the frequency of said reference signal;

incrementing said frequency control value when said frequency offset is positive; and decrementing said frequency control value when said frequency offset is negative.

8. The method of claim 7, wherein a number of remote units transmit information to said local unit at different times, further comprising the step of:

generating a different frequency control value based on which of said remote units is transmitting.

9. The method of claim 6, wherein said step of determining said frequency offset is repeated over a predetermined period of time, said step of adjusting said reference signal comprising the steps of:

generating a frequency control value representative of a frequency of said reference signal;

accumulating each frequency offset so determined resulting in an accumulated offset value;

comparing said accumulated offset value to a predetermined threshold;

incrementing said frequency control value if said accumulated offset value is greater than said predetermined threshold; and decrementing said frequency control value if said accumulated offset value is less than said predetermined value.

10. The method of claim 10, wherein said predetermined threshold being based upon an expected frequency of said calls.

11. The method of claim 5, wherein the frequency of said reference signal is adjusted in fixed increments.

12. A method of minimizing frequency offset between a remote unit and a local unit wherein a number of transmissions between said remote and local units define a call, comprising the steps of:

transmitting a signal from said remote unit to said local unit such that said local unit receives said transmitted signal, said transmitted signal having a predetermined operating frequency;

determining, upon the completion of each call, a frequency offset indicative of a difference between said predetermined operating frequency and a frequency of said transmitted signal as received by said local unit; and adjusting, upon the completion of each call, the frequency of a local reference signal generated by said local unit based on said frequency offset to minimize said frequency offset thereby eliminating signal distortion of said transmitted signal while said transmitted signal is being received by said local unit.

13. The method of claim 12, wherein said adjusted local reference frequency is utilized by said local unit to subsequently transmit a signal to said remote unit.

14. The method of claim 12, wherein said remote unit transmits to said local unit during a period of time defining a slot and said local unit receiving said transmitted signal during said slot, said step of determining said frequency offset being carried out during each slot in which a transmission is received by said local unit.

15. The method of claim 14, wherein said step of adjusting the frequency of said local reference signal is repeated upon completion of each call based on the last frequency offset so determined.

16. The method of claim 15, further comprising the steps of:

accumulating said last frequency offset following each call: and adjusting said local reference frequency if said frequency offset exceeds a predetermined threshold.

17. The method of claim 16, wherein said predetermined threshold is based on an expected frequency of said calls.

18. The method of claim 12, wherein the frequency of said reference signal is adjusted in fixed increments.

* * * * *